United States Patent [19]

Fujimori

[11] Patent Number: 6,036,431

[45] Date of Patent: Mar. 14, 2000

[54] PARTS HANDLING METHOD

[75] Inventor: Hiroaki Fujimori, Suwa, Japan

[73] Assignee: Seiko Epson Corporation, Tokyo, Japan

[21] Appl. No.: 09/234,727

[22] Filed: Jan. 21, 1999

Related U.S. Application Data

[62] Division of application No. 08/890,266, Jul. 9, 1997.

[30] Foreign Application Priority Data

Jul. 15, 1996 [JP] Japan ................................. 8-185200
May 16, 1997 [JP] Japan ................................. 9-127691

[51] Int. Cl.⁷ ..................................................... B65G 47/91
[52] U.S. Cl. ........................... 414/806; 414/225; 414/751; 74/490.09; 198/468.4
[58] Field of Search ..................................... 414/806, 222, 414/225, 226, 752, 751, 749; 901/8, 7; 74/490.09; 198/468.4, 468.6, 346.2

[56] References Cited

U.S. PATENT DOCUMENTS

| | | | |
|---|---|---|---|
| 4,268,219 | 5/1981 | Nakagawa et al. ....................... | 414/806 |
| 4,784,562 | 11/1988 | Kishi et al. .............................. | 414/225 |
| 4,818,169 | 4/1989 | Schram et al. ....................... | 414/225 X |
| 5,002,448 | 3/1991 | Kamijima et al. ....................... | 414/225 |
| 5,040,291 | 8/1991 | Janisiewicz et al. ................... | 414/225 |
| 5,074,741 | 12/1991 | Johansson ............................... | 414/225 |
| 5,135,376 | 8/1992 | Watanabe et al. ....................... | 414/225 |
| 5,310,039 | 5/1994 | Butera et al. ............................. | 414/225 |
| 5,330,043 | 7/1994 | Stuckey .................................. | 198/346.2 |
| 5,469,953 | 11/1995 | Igarashi et al. . | |
| 5,486,080 | 1/1996 | Sieradzki ............................ | 414/806 X |

FOREIGN PATENT DOCUMENTS

| | | |
|---|---|---|
| 195 12 144 | 1/1996 | Germany . |
| 6-64180 | 9/1994 | Japan . |
| 8-292233 | 11/1996 | Japan . |

*Primary Examiner*—Robert P. Olszewski
*Assistant Examiner*—Gerald O'Connor
*Attorney, Agent, or Firm*—Eric B. Janofsky

[57] ABSTRACT

A new parts handling apparatus is provided which can shorten the index time and increase working ability without increasing the number of components and can restrict the rise of manufacturing cost. X driving member 12 to be moved rightward and leftward in correlation to the rotation of a ball screw 2 by a servomotor 1 is provided with a pair of right and left movable members 7 mounted movably in the Z direction. Two contact hands 5 are attached to each movable member 7 through aligning mechanisms 8 respectively. Each movable member 7 is provided with a Z driving member 6 mounted slidably in the X direction. The Z driving member 6 is engaged with a ball screw 4, and the ball screw 4 is connected to a servomotor 3. When the ball screw 4 is rotated by the servomotor 3, the Z driving member 6 moves vertically in the figure, thereby also moving the movable member 7 vertically.

3 Claims, 9 Drawing Sheets

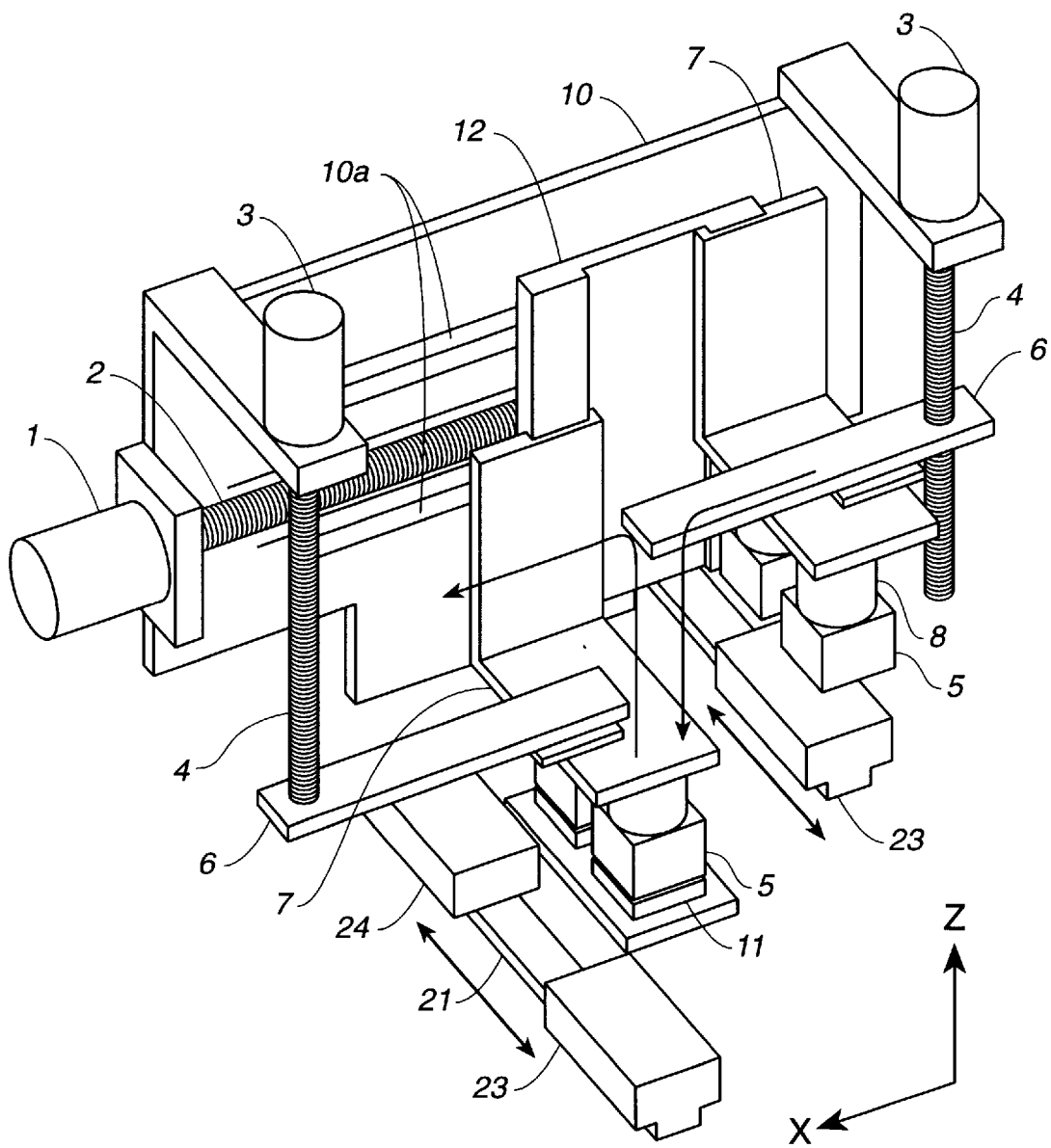
FIG._1

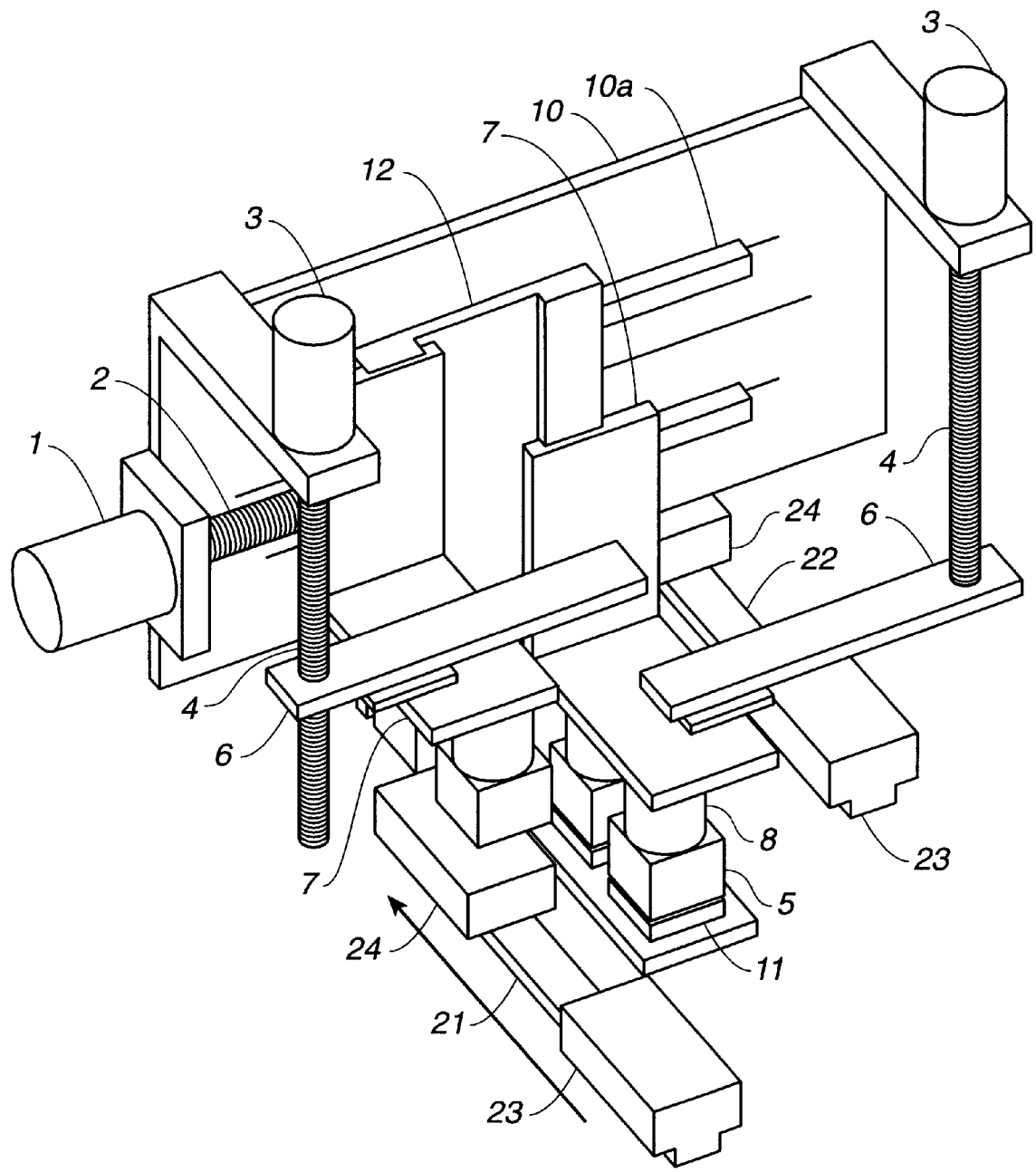
FIG._2

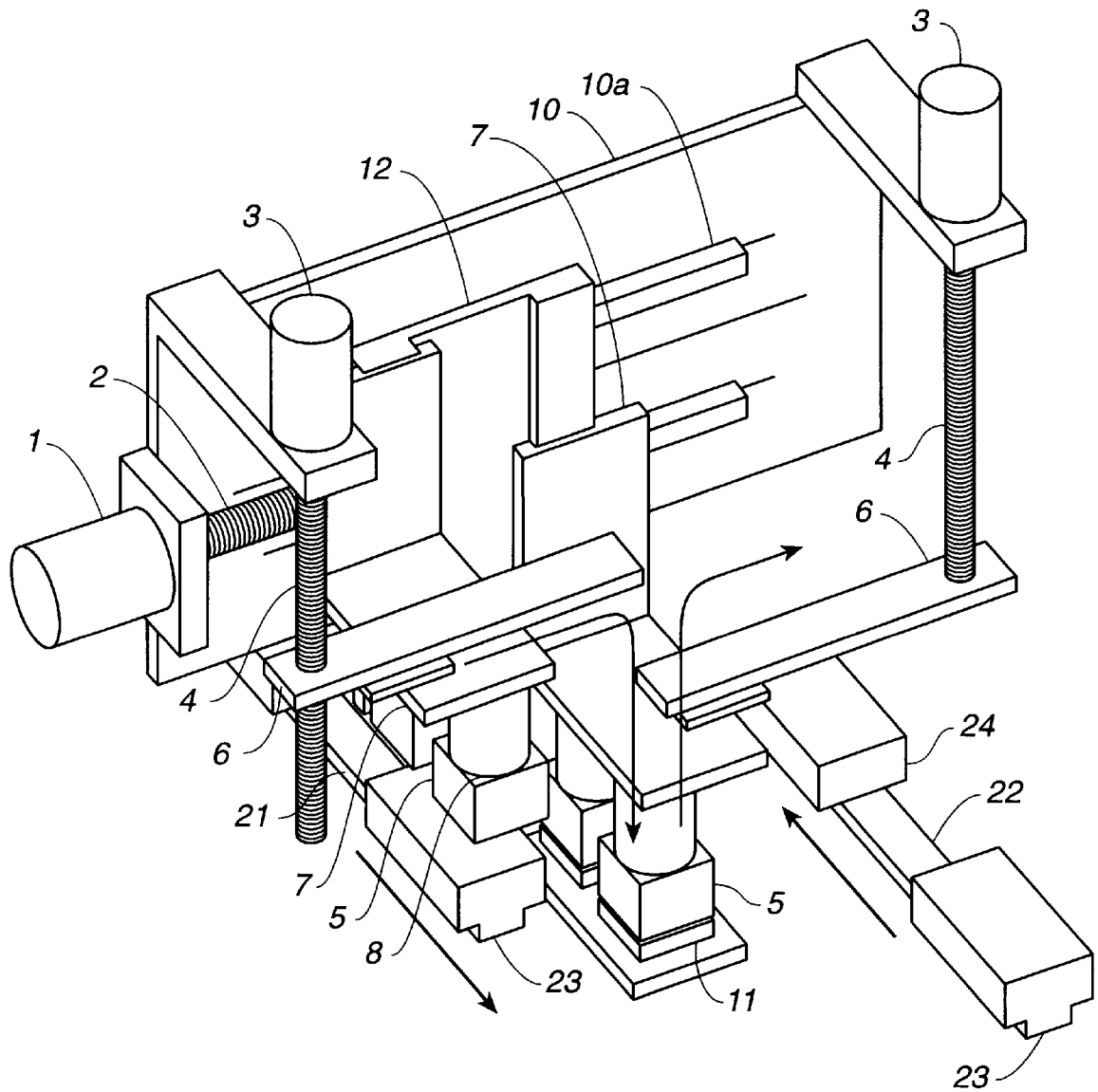
FIG._3

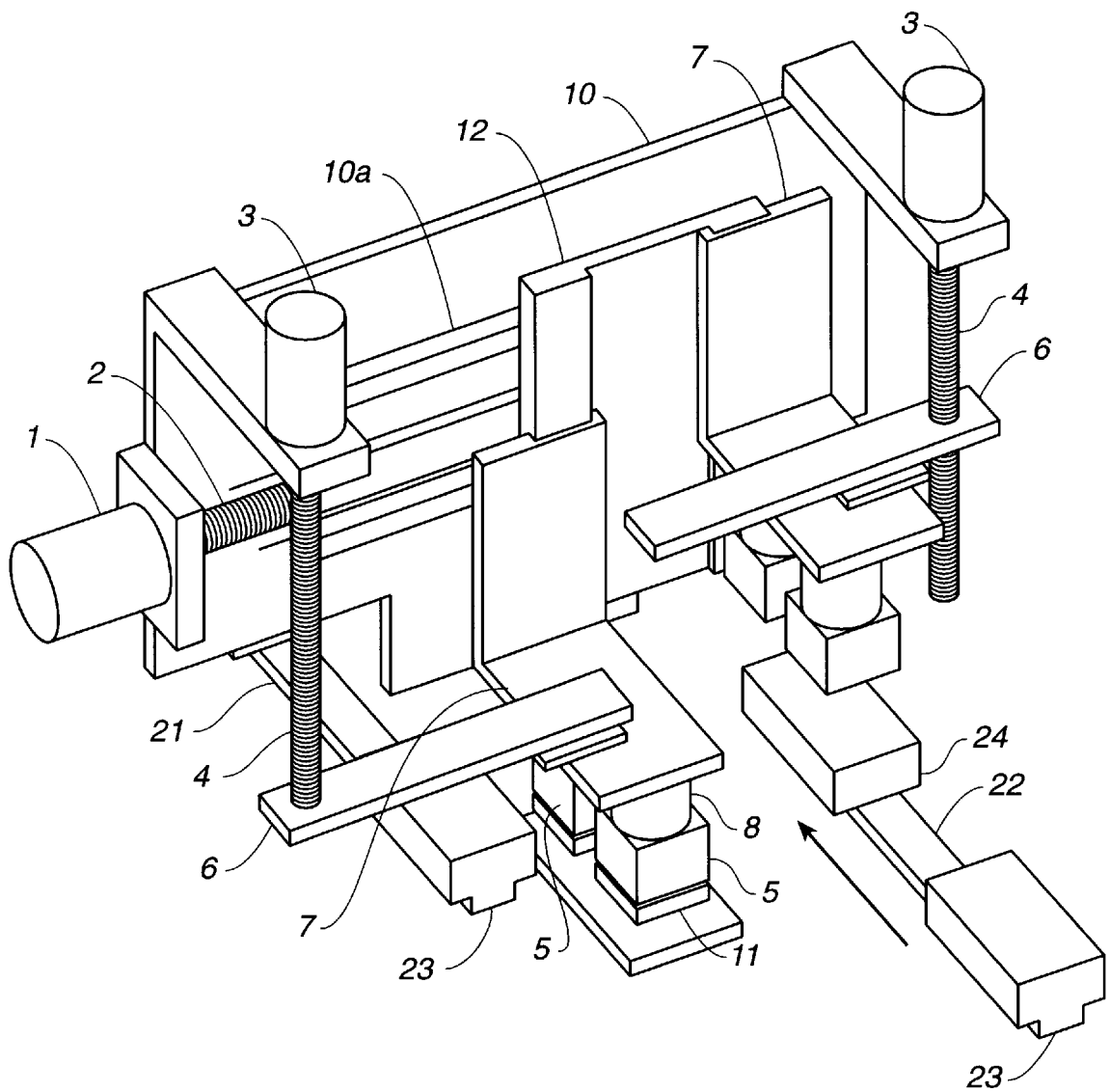
FIG._4

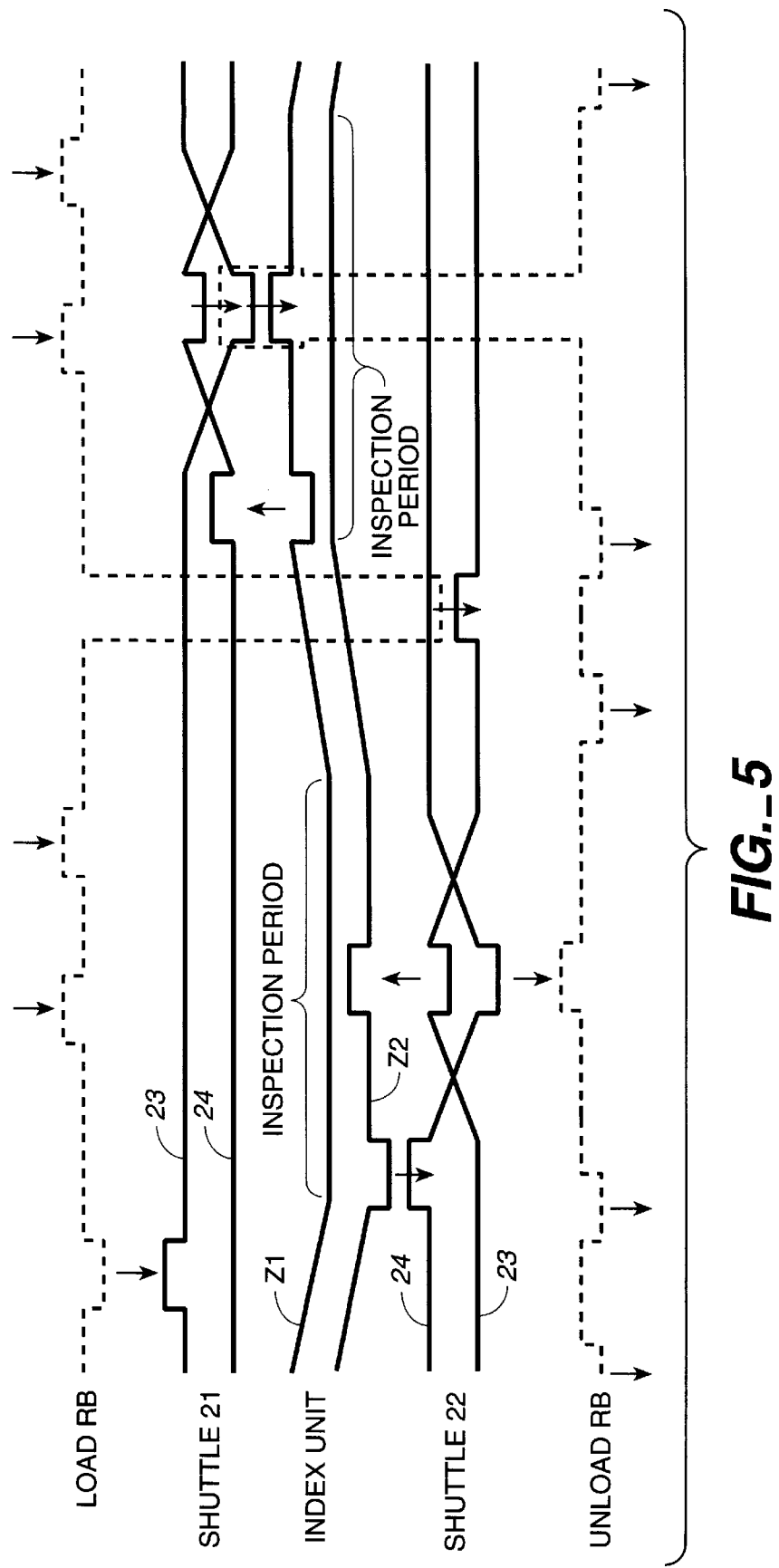
FIG._5

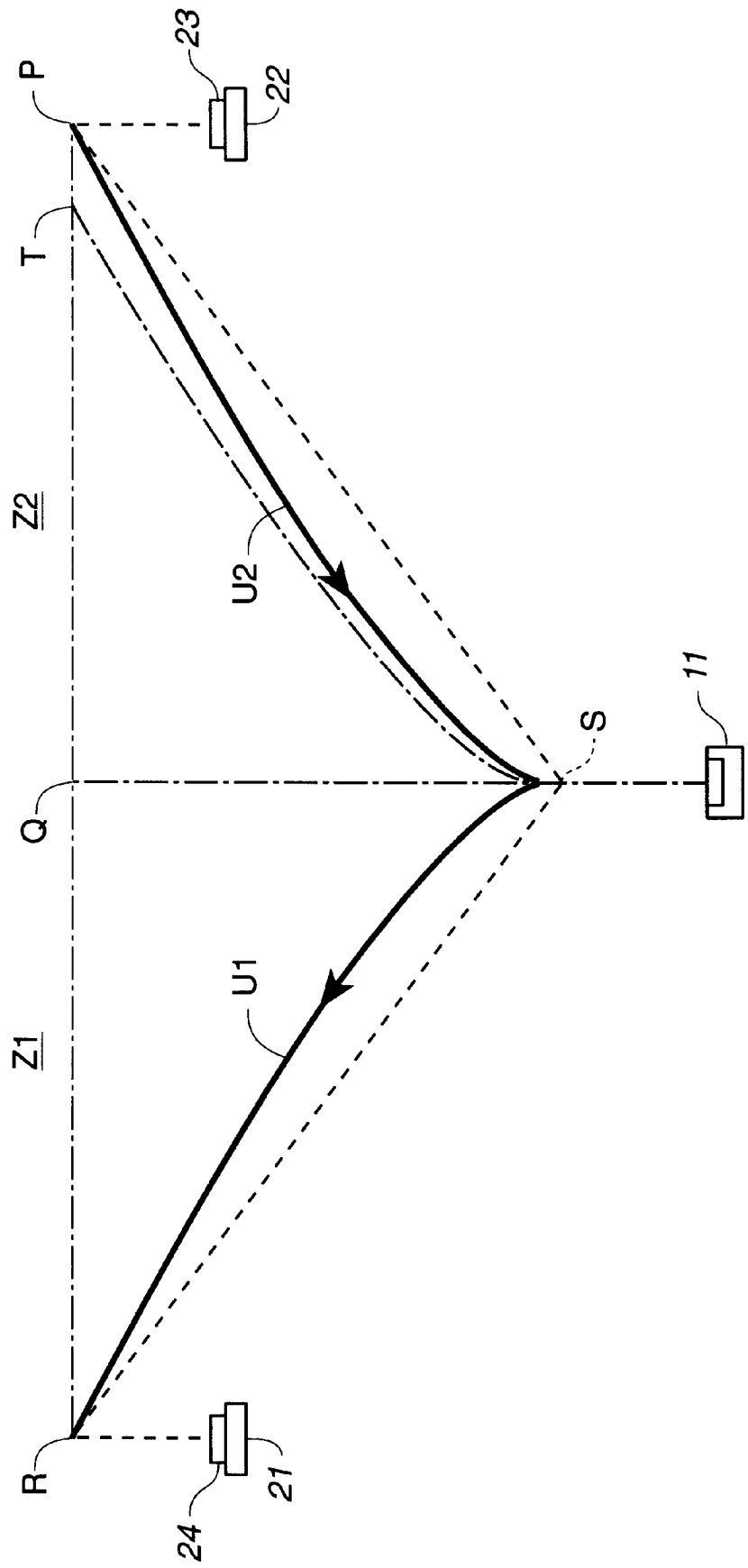
FIG._6

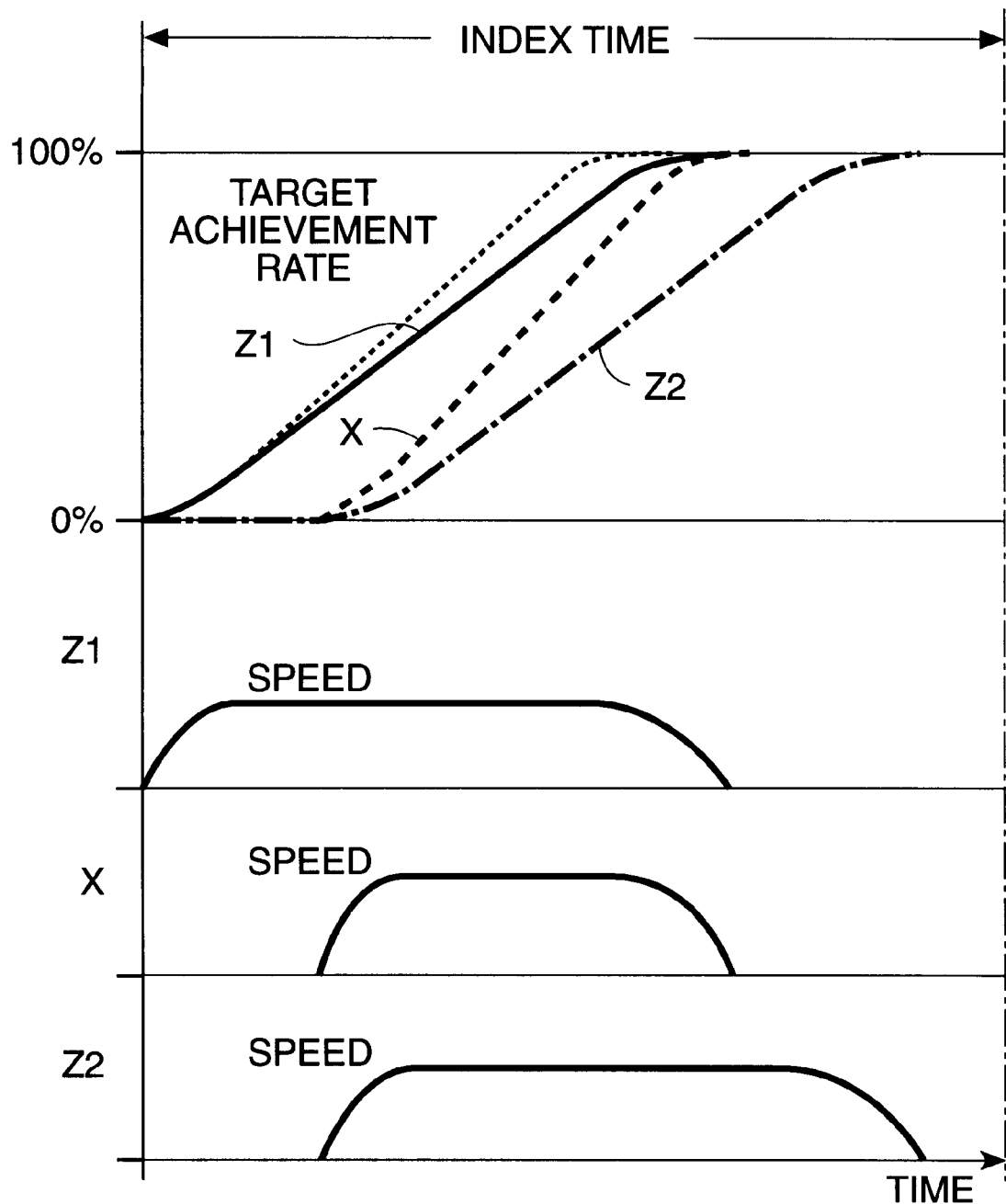
FIG._7

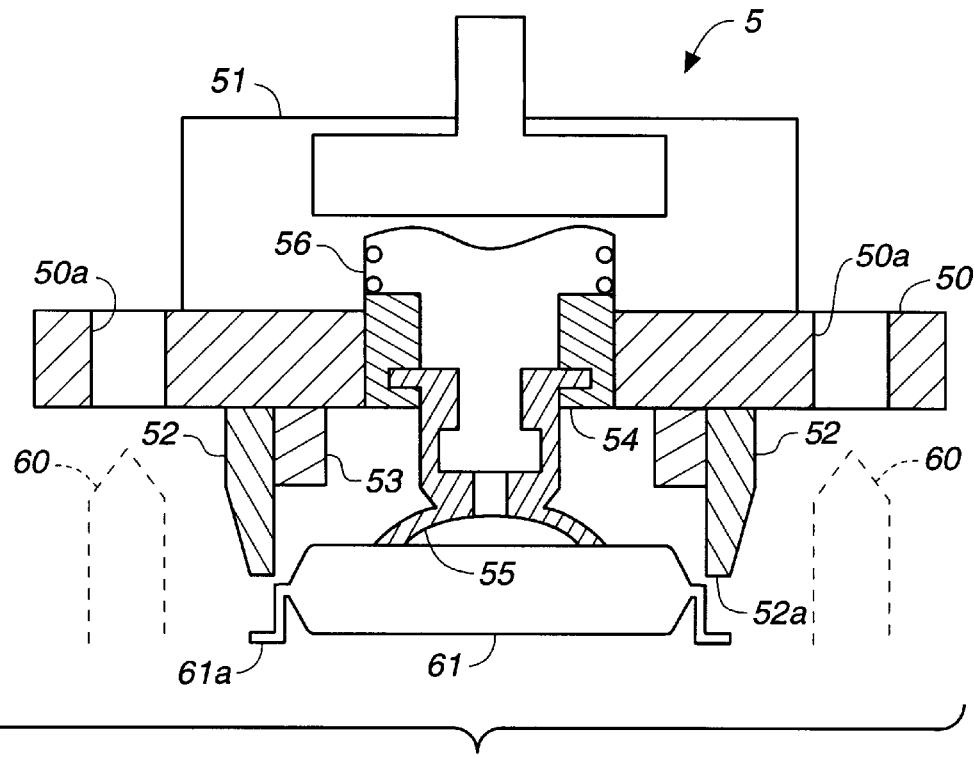
FIG._8A
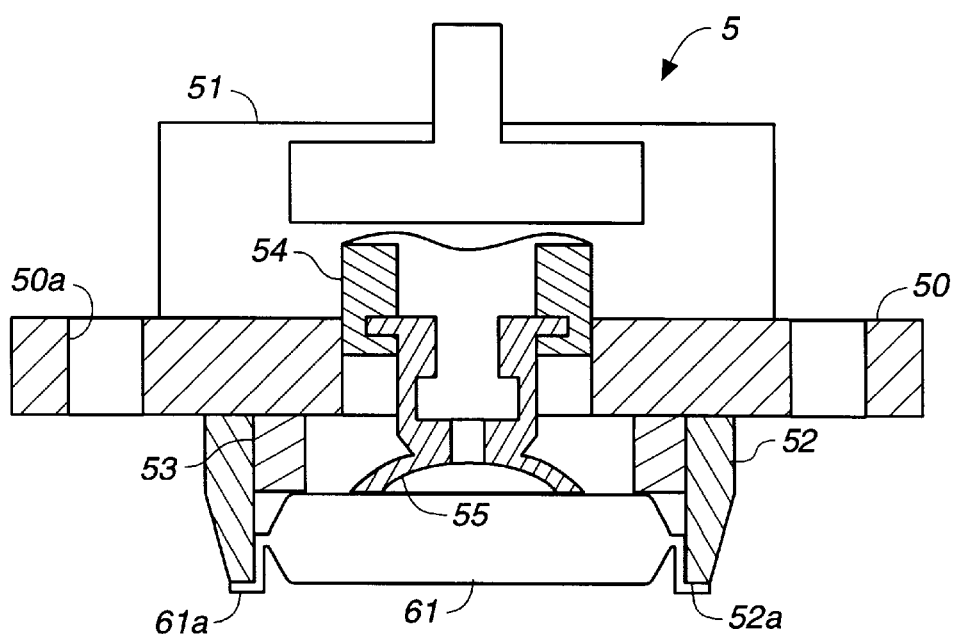
FIG._8B

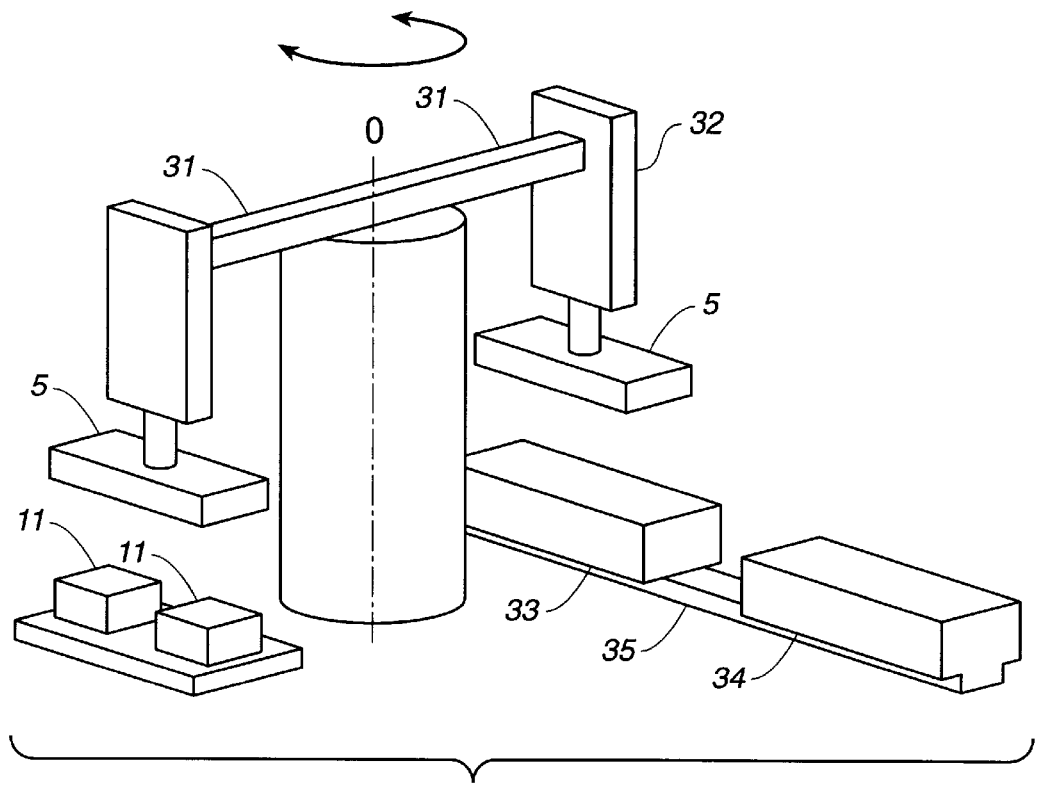
FIG._9 (PRIOR ART)
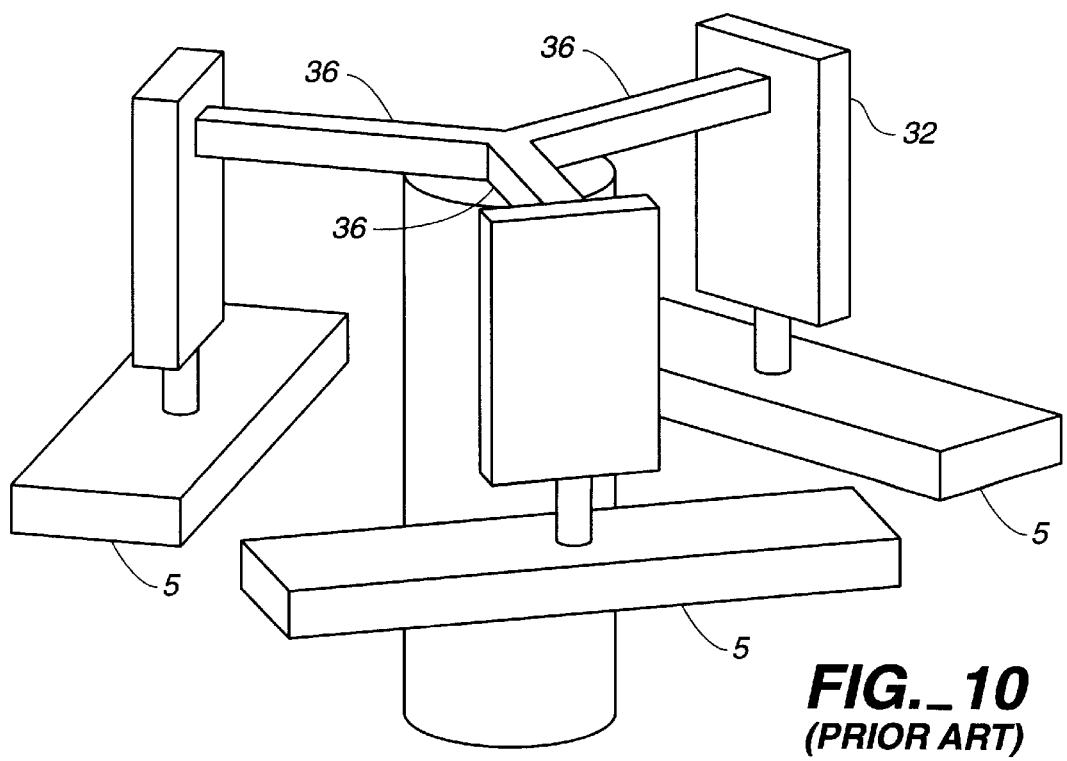
FIG._10 (PRIOR ART)

PARTS HANDLING METHOD

CROSS REFERENCE TO RELATED APPLICATIONS

This application is a divisional of U.S. patent application Ser. No. 08/890,266, filed Jul. 9, 1997, which is incorporated herein in its entirety by reference.

BACKGROUND OF THE INVENTION

1. Field of the Invention

The present invention relates to a parts handling apparatus, and more particularly, to a structure of an apparatus best-suited to handle electronic parts in an electrical characteristic inspection of integrated circuit (IC) devices.

2. Description of the Related Art

In a conventional process of inspecting the characteristics of integrated circuits (ICs), an IC handler is used to sequentially place many IC devices in an inspection position and to inspect the IC devices. The IC handler is provided with a contact hand for holding the IC device by suction. The contact hand repeats operations of carrying an IC device from a parts supply position, supplying the IC device to an inspection socket located in the inspection position, taking the IC device out of the inspection socket at the completion of an electric characteristic inspection on the IC device, and carrying the IC device to a parts discharge position.

In the characteristic inspection process using the IC handler, it is required to make an inspection on many IC devices in a short time. Here, the time, which is used to take an inspected IC device out of the inspection socket, to set the next IC device to be inspected on the inspection socket and to put outer terminals of the IC device into a stable contact with the inspection socket, is called "index time". In the above process, it is most important to shorten the index time, and the performance of the IC handler is evaluated by the length of the index time thereof.

One of the most effective methods for shortening the index time is to provide a plurality of contact hands, usually two contact hands, for accessing one inspection position. The provision of two contact hands makes it possible that one contact hand takes an inspected IC device out of the inspection socket and the other contact hand immediately sets an uninspected IC device on the inspection socket. Therefore, the index time of the IC handler can be shortened.

FIG. 9 shows the schematic structure of an IC handler which shortens the index time as mentioned above. In this IC handler, two inspection sockets 11 are placed in an inspection position, and a parts discharge stage 33 for receiving two IC devices from the inspection sockets 11 and a parts supply stage 34 for supplying two IC devices to the inspection sockets 11 are fixed on a shuttle 35 located on one side of the inspection sockets 11 and 11. The shuttle 35 is so structured as to reciprocate in the extending direction thereof and to put the parts discharge stage 33 and the parts supply stage 34 into a predetermined supply and discharge position (IC device handling position) alternately.

Two turning arms 31, spaced at 180° about a turning shaft O, are interposed between the inspection sockets 11 and the shuttle 35. The two turning arms 31 turn about the vertical shaft O integrally on a horizontal plane. Each of the turning arms 31 is provided with a transfer mechanism 32 fixed at the leading end thereof, and a contact hand 5 is mounted at the bottom end of the transfer mechanism 32 to be movable upward and downward. The contact hand 5 can grasp two IC devices arranged on the parts supply stage 34 at a time, and place the IC devices on the inspection sockets while grasping. When one transfer mechanism 32 at the leading end of the turning arm 31 is placed just above the inspection position, the other transfer mechanism 32 is placed just above the handling position on the shuttle 35. The two transfer mechanisms 32 transfer IC devices from the parts supply stage 34 to the inspection sockets 11, and from the inspection sockets 11 to the parts discharge stage 33, alternately.

In the state shown in FIG. 9, unillustrated IC devices are held by the contact hand 5 placed just above the inspection sockets 11, and set on the inspection sockets 11 by moving the contact hand 5 downward. On the other hand, inspected IC devices are held by the contact hand 5 placed above the shuttle 35, and put onto the parts discharge stage 33 in the handling position on the shuttle 35 by moving the contact hand 5 downward.

Next, after the parts supply stage 34 is put into the handling position by moving the shuttle 35, the contact hand 5 moves down, takes uninspected IC devices from the parts supply stage 34, and moves up again. When the characteristic inspection on the IC devices set on the inspection sockets 11 is completed, the contact hand 5 grasping the inspected IC devices moves upward.

The two turning arms 31 turn through 180° in this state, and thereby, the contact hand 5 grasping the uninspected IC devices is moved above the inspection sockets 11 and the contact hand 5 grasping the inspected IC devices is moved above the handling position on the shuttle 35. At this time, the empty parts discharge stage 33 is placed in the handling position on the shuttle 35.

In this IC handler, since the IC devices are supplied and discharged alternately by the two contact hands 5 while turning the turning arms 31 through 180°, the index time equals to the sum of the time taken for one contact hand 5 to take IC devices from the inspection sockets 11, and the turning time of the turning arms 31 and the time taken for the other contact hand 5 to set IC devices.

However, since the IC devices are conveyed from the handling position to the inspection position by turning the turning arms 31 in the above-mentioned IC handler, the conveyance trail of the IC devices is shaped like an arc, and the conveyance distance is p/2 times as long as that of the linear movement. Therefore, in order to obtain an index time equivalent to that of the linear movement of the IC devices, the conveyance speed and acceleration required to convey the IC devices are both increased, which needs a higher-powered drive source and a more rigid conveying mechanism. Particularly, in order to turn the transfer mechanism 32 and the contact hand 5, which are provided with heavy components such as a driving cylinder and a motor, more swiftly, high driving power is needed to increase the acceleration and deceleration. Therefore, it is quite difficult to achieve such swiftness while keeping the precision of the conveyance position and the structural precision.

As another method for further shortening the index time, it is thought of to increase the number of turning arms as shown in FIG. 10. In the structure shown in FIG. 10, three turning arms 36 are located about a turning shaft. Since the turning arms 36 are spaced at 120°, it seems that the moving distance of IC devices is decreased and thereby the index time is shortened. However, this case requires each of the three turning arms 36 to be provided with a transfer device 32 and a contact hand 5 at the leading end thereof, which increases the number of components of the apparatus and the weight of the moving parts, and needs higher driving power.

Therefore, it is difficult to increase the operation speed of individual moving parts, and the manufacturing cost of the IC handler increases.

Furthermore, in the IC handler shown in FIG. 10, it can be thought of that the inspection ability is enhanced without shortening the index time by increasing the number of IC devices to be grasped by each contact hand 5 and the number of IC devices to be inspected by the inspection socket 11 at a time. However, in this method, the manufacturing cost of the contact hand 5 and the socket 11 increases according to the increased number of IC devices, and the turning radius is required to be increased by making the turning arms 36 longer in order to prevent the interference among the contact hands 5 resulting from the increased length thereof in the turning direction. As a result, the moving distance of the IC devices is increased, and thereby the index time is increased on the contrary.

OBJECTS OF THE INVENTION

It is an object of the present invention to obviate the above-mentioned problem. It is another object of the present invention to provide a new parts handling apparatus which can shorten the index time and increase working ability without increasing the number of components and can thereby restrict the rise of manufacturing cost.

SUMMARY OF THE INVENTION

In accordance with an aspect of the present invention a parts handling apparatus comprises a processing section for subjecting a part to a predetermined process, a first handling section for supplying and discharging the part placed on one side of the processing section, a second handling section for supplying and discharging the part placed on the other side of the processing section, a first holding section capable of moving between the processing section and the first handling section and holding the part, a second holding section capable of moving between the processing section and the second handling section and holding the part, a main driving means for making the first and second holding sections reciprocate alternately from the first and second handling sections toward the processing section, a first auxiliary driving means for moving the first holding section close to and apart from the processing section and the first handling section, and a second auxiliary driving means for moving the second holding section close to and apart from the processing section and the second handling section.

Since the first handling section and the second handling section are placed on both sides of the processing section and parts are supplied and discharged alternately from both sides by the first holding section and the second holding section, the conveyance route of the parts is freely determined and the index time can be shortened by short-circuiting the conveyance route.

It is preferable that the main driving means reciprocate the first and second holding sections linearly in a first direction, and that the first and second auxiliary driving means reciprocate the first and second holding sections linearly in a second direction intersecting the first direction.

Moreover, since the first and second holding sections are moved linearly close to and apart from the processing section and the first and second handling sections by being moved linearly in the first direction by the main driving means between the processing section and the first and second handling sections, it is possible to simplify the structures of the main driving means and the first and second auxiliary driving means and to reduce the manufacturing cost of the apparatus.

Furthermore, it is preferable in this case that the first auxiliary driving means have a first connecting member for engaging the first holding section therewith movably in the first direction and holding the first holding section in the second direction, and a first drive source fixed to move the first connecting member in the second direction, and that the second auxiliary driving means have a second connecting means for engaging the second holding section therewith movably in the first direction and holding the second holding section in the second direction and a second drive source fixed to move the second connecting member in the second direction.

Although the first and second auxiliary driving means respectively move the first and second holding sections by moving the first and second connecting members by means of the first and second drive sources, since the first and second connecting members are movable in the first direction, the first and second auxiliary driving means do not obstruct the movement made by the main driving means and the driving load of the main driving means can be reduced. Therefore, it is easy to increase the driving speed of the first and second holding sections and to maintain driving accuracy.

Furthermore, it is preferable that a period of movement of the first and second holding sections in the first direction through the main driving means and a period of movement of the first and second holding sections in the second direction through the first and second auxiliary driving means overlap at least partially.

In this case, particularly, it is effective in shortening the index time to set the moving route of the first and second holding sections linearly as short as possible to a degree where there is no interference with peripheral mechanisms. Although the moving route is set to be linear, it is more preferable to set the moving route smoothly in accordance with the acceleration and deceleration characteristics of the main driving means and the first and second auxiliary driving means.

According to this means, since the period of movement made by the main driving means and the period of movement made by the first and second auxiliary driving means overlap, it is possible to optimize the moving route of the first and second holding sections, and to further shorten the index time by changing the setting of the moving route.

Additionally, it is preferable that the main driving means be a single driving system so structured as to move the first and second holding sections in the same direction at the same speed.

Since the first and second holding sections are moved by a single driving system in the same direction at the same speed, it is possible to simplify the structure of the driving system and to reduce the manufacturing cost of the apparatus.

As the main driving means, separate drive sources or driving members may control the first and second holding sections respectively.

Other objects and attainments together with a fuller understanding of the invention will become apparent and appreciated by referring to the following description and claims taken in conjunction with the accompanying drawings.

BRIEF DESCRIPTION OF THE DRAWINGS

In the drawings wherein like reference symbols refer to like parts.

FIG. 1 is a schematic perspective view showing a first operation state of a main structure of a parts handling apparatus according to an embodiment of the present invention;

FIG. 2 is a schematic perspective view showing a second operation state of the present invention;

FIG. 3 is a schematic perspective view showing a third operation state of the present invention;

FIG. 4 is a schematic perspective view showing a fourth operation state of the present invention;

FIG. 5 is a timing diagram showing operations of various members of the present invention;

FIG. 6 is a view explaining movements of a pair of contact hands of the present invention;

FIG. 7 is a graph showing operation states of X, Z1-axis and Z2-axis driving systems of the present invention;

FIGS. 8A and 8B are partially enlarged cross-sectional views showing the structure of the contact hand of the present invention;

FIG. 9 is a schematic perspective view showing the structure of a conventional IC handler; and FIG. 10 is a schematic perspective view showing the structure of another conventional IC handler.

DESCRIPTION OF THE PREFERRED EMBODIMENTS

An embodiment of the present invention will be next described with reference to the accompanying drawings. FIGS. 1 to 4 show a main mechanism of a parts handling apparatus according to the embodiment of the present invention, and illustrate a series of operation steps of the apparatus in order.

In this embodiment, a servomotor 1 fixed on a frame 10 rotates a ball screw 2 extending in the rightward and leftward direction in the figure (referred to as "X direction" hereinafter). Two guide rails 10a extending in the X direction are fixed on frame 10. An X driving member 12 is mounted movably in the X direction on guide rails 10a, and engaged with ball screw 2 to be moved in the X direction in correlation to the rotation of ball screw 2.

X driving member 12 is provided with a pair of right and left movable members 7 which are movable in the vertical direction in the figure (referred to as "Z direction" hereinafter). Movable members 7 are each provided with two contact hands 5 as holding members through respective aligning mechanisms 8. Each of contact hands 5 has a suction mechanism for holding an IC device by suction, which will be described later, and a mechanism for pressing outer terminals of the IC device against an inspection socket which will be also described later. Aligning mechanism 8 is a well-known mechanism for fitting the position of contact hand 5 for the inspection socket, a parts supply stage and a parts discharge stage.

Z driving members 6 are respectively mounted slidably in the X direction on the movable members 7, and engaged with ball screws 4 which are respectively connected to servomotors 3 fixed on frame 10. When ball screw 4 is rotated by servomotor 3, Z driving member 6 moves up and down, thereby moving movable member 7 up and down.

In the following description, a mechanism consisting of movable member 7, Z driving member 6, ball screw 4 and servomotor 3 on the left side is referred to as a Z1-axis driving system, and a mechanism consisting of movable member 7, Z driving member 6, ball screw 4 and servomotor 3 on the right side is referred to as a Z2-axis driving system. A mechanism consisting of X driving member 12, ball screw 2 and servomotor 1 is referred to as an X-axis driving system.

Two inspection sockets 11 are placed as a processing section at the center below the above mechanisms, and each are provided with an inspection pad corresponding to outer terminals of an IC device. When the outer terminals of the IC device are brought into contact with the inspection pad of inspection socket 11, the inspection on the electrical characteristics of the IC device is performed.

On the other hand, shuttles 21 and 22 are placed on the left and right sides of inspection sockets 11 (in the X direction) to reciprocate in the forward and backward directions in the figure. Inspection sockets 11 are positioned just at the midpoint between shuttles 21 and 22. A parts supply stage 23 and a parts discharge stage 24 are fixed on each of shuttles 21 and 22. Parts supply stage 23 and parts discharge stage 24 can each hold two IC devices corresponding to two contact hands 5 mounted on movable member 7. Parts supply stage 23 holds two uninspected IC devices, and supplies the IC devices to contact hands 5, and parts discharge stage 24 receives inspected IC devices from contact hands 5, and discharges the IC devices.

The above Z1-axis driving system transfers IC devices between the shuttle 21 and the inspection sockets 11, and the Z2-axis driving system transfers IC devices between the shuttle 22 and the inspection sockets 11. When X driving member 12 moves in the X direction, and, for example, the Z1-axis driving system moves from shuttle 21 to inspection sockets 11, and the Z2-axis driving system moves from the inspection sockets 11 to the shuttle 22. Although not illustrated, a loading robot for supplying IC devices to parts supply stage 23 and an unloading robot for taking IC devices out of parts discharge stage 24 are respectively placed in front of and behind shuttles 21 and 22.

In the above inspection apparatus, the following operations are performed. First, as shown in FIG. 1, Z1-axis contact hands 5 press two IC devices against inspection sockets 11 to make inspection. At this time, Z2-axis contact hands 5 are standing by above a handling position preset on shuttle 22 while holding two uninspected IC devices taken out of the parts supply stage 23. On the other hand, empty part discharge stage 24 is already standing by at a handling position on the shuttle 21.

Next, when the inspection on the IC devices at the inspection sockets 11 is completed, Z1-axis servomotor 3 is put into operation, Z driving member 6 is lifted in correlation to the rotation of ball screw 4, and Z1-axis contact hands 5 pull the inspected IC devices up from inspection sockets 11. Then, servomotor 1 is put into operation, and the X driving member 12 starts to move leftward in correlation to rotation of the ball screw 2. When X driving member 12 moves, contact hands 5 in both the Z1 and Z2 axis driving systems move together in the leftward direction in the figure. In a short time, Z1-axis contact hands 5 arrive above the handling position on the shuttle 21, and Z2-axis contact hands 5 arrive above the inspection sockets 11.

Then, Z2-axis servomotor 3 is put into operation, Z driving member 6 is moved down in correlation to the rotation of ball screw 4, and Z2-axis contact hands 5 press the uninspected IC devices against the respective inspection sockets as shown in FIG. 2. On the other hand, Z1-axis contact hands 5 also move down and transfer the inspected IC devices onto parts discharge stage 24.

As shown in FIG. 3, while inspection is being made on the IC devices pressed against the inspection sockets 11 by Z2-axis contact hands 5, shuttle 21 moves backward to move parts discharge stage 24 backward and positions parts supply stage 23 to the handling position. On the other hand, shuttle 22 moves forward and positions parts discharge stage 24 to the handling position.

When the inspection on the IC devices is completed, Z2-axis contact hands 5 move up above the handling position on shuttle 22 as shown in FIG. 4, and, on the other hand, Z1-axis contact hands 5 press and contact uninspected IC devices with inspection sockets 11. Z2-axis contact hands 5 move down and transfer the IC devices to parts discharge stage 24.

This apparatus repeats the above-mentioned operations shown in FIGS. 1 to 4, and the Z1-axis and Z2-axis driving systems operate to alternately supply IC devices to inspection sockets 11. FIG. 5 is a timing diagram showing the above operations and the operations of the loading robot and the unloading robot. IC device receiving operations performed at the sections are indicated by projections and IC device transferring operations performed at the sections are indicated by recesses in the diagram. Although two lines respectively representing the positions of parts supply stage 23 and parts discharge stage 24 are drawn at shuttle 21, the lower line indicates the stage in the handling position. Similarly, although two lines respectively representing the positions of parts supply stage 23 and parts discharge stage 24 are drawn at shuttle 22, the upper line indicates the stage in the handling position. Furthermore, in an index unit, the upper solid line indicates the operation of Z1-axis driving system and the lower solid line indicates the operation of Z2-axis driving system. An inspection period in the figure refers to a period in which IC devices are inspected at inspection sockets 11.

The loading robot repeats operations of transferring uninspected IC devices onto parts supply stage 23 on shuttle 21, two at a time, sequentially receiving two new IC devices from a parts supply tray or the like where IC devices are arranged, transferring the IC devices onto parts supply stage 23 on shuttle 22, two at a time, and sequentially receiving two IC devices again from the parts supply tray or the like.

On shuttle 21, parts supply stage 23 receives two uninspected IC devices from the loading robot, parts discharge stage 24 receives inspected IC devices from the Z1-axis contact hands 5, parts supply stage 23 moves to the handling position, and then, the IC devices held by parts supply stage 23 are transferred to the Z1-axis contact hands 5. At the same time, the inspected IC devices held by parts discharge stage 24 are taken out by the unloading robot.

In the index unit, the positions and operations of Z1-axis and Z2-axis contact hands 5 are shown. In the same manner as above, Z1-axis contact hands 5 press and fix IC devices on inspection sockets 11 for inspection, and move toward shuttle 21 at the completion of inspection. At this time, Z2-axis contact hands 5 transfer the inspected IC devices onto parts discharge stage 24 on shuttle 22, receive new IC devices from the parts supply stage 23, and move toward the inspection position. After that, Z2-axis contact hands 5 transfer the inspected IC devices onto parts discharge stage 24 on shuttle 22. On the other hand, Z1-axis contact hands 5 transfer the inspected IC devices onto parts discharge stage 24 on shuttle 21, and Z2-axis contact hands 5 press the IC devices against inspection sockets 11 for inspection.

Shuttle 22 repeats just the same operations as those of shuttle 21. The unloading robot receives inspected IC devices two by two from parts discharge stages 24 on shuttles 21 and 22, and then, sequentially puts the IC devices into a predetermined position on an unillustrated inspected parts tray.

FIG. 6 illustrates the operations of Z1-axis and Z2-axis contact hands 5. Each Z1-axis contact hand 5 reciprocates between shuttle 21 and inspection socket 11, and each Z2-axis contact hand 5 reciprocates between shuttle 22 and inspection socket 11. FIG. 6 shows a case in which Z1-axis contact hand 5 conveys an inspected IC device from the inspection socket 11 to parts discharge stage 24 on shuttle 21 (parts discharge operation) and Z2-axis contact hand 5 conveys an uninspected IC device from parts supply stage 23 on shuttle 22 (parts supply operation). The Z1-axis parts supply operation and the Z2-axis parts discharge operation are performed symmetrically with the Z2-axis parts supply operation and the Z1-axis parts discharge operation.

First, the most basic operation mode will be described. In this mode, in order to shorten the index time, while Z1-axis contact hand 5 is pressing the IC device under inspection at the inspection socket 11, Z2-axis contact hand 5 takes an uninspected IC device out of parts supply stage 23 on shuttle 22, Z driving member 6 is moved up, and contact hand 5 is set to stand by at a standby point P set at a predetermined height from parts supply stage 23.

Next, when the inspection at inspection socket 11 is completed, Z1-axis contact hand 5 moves upward through a takeout point S, and reaches a center point Q above the inspection socket 11 as indicated by an alternate long and short dashed line in the figure. Then, Z1-axis contact hand and Z2-axis contact hand are both moved leftward horizontally along the alternate long and short dashed line by moving X driving member 12 leftward. Z1-axis contact hand 5 reaches a standby point R, and Z2-axis contact hand 5 reaches the center point Q. After that, Z2-axis contact hand 5 is moved down vertically from the center point Q together with the Z driving member 6, and pressed against inspection socket 11. As mentioned above, in this basic operation mode, the time, during which Z1-axis contact hand 5 reaches the center point Q from the inspection socket 11 and the Z2-axis contact hand reaches the inspection socket 11 from the standby point P through the center point Q, is taken as index time.

However, in such an operation mode, the moving route of the contact hand is wasteful as indicated by the alternate long and short dashed line, and the index time is not yet sufficiently reduced. In order to save lifting time from inspection socket 11 to the center point Q, the operation periods of X driving member 12 and Z driving member 6 are corrected, so that X driving member 12 is moved to the standby point R moment Z1-axis contact hand 5 reaches the takeout point S set above inspection socket 11, and Z2-axis contact hand 5 is moved from the standby point P to the takeout point S. Routes are schematically shown by a dotted line in the figure.

In this case, the takeout point S is set as low as possible to a degree where the contact hand 5 can move in the horizontal direction without interfering with the mechanisms on the periphery of inspection socket 11. The lower the takeout point S is, the shorter the index time is.

When Z1-axis contact hand 5 moves up from inspection sockets 11 together with Z driving member 6 and reaches the takeout point S, X driving member 12 starts to move leftward. The mutually parallel upward movement of Z driving member 6 and leftward movement of X driving member 12 allow the contact hand to move toward the standby point R along a route denoted by U1 in FIG. 6. On the other hand, when Z driving member 6 starts to move downward almost simultaneously with the start of movement of the X driving member 12, Z2-axis contact hand 5 is thereby moved toward the takeout point S along a route denoted by U2 in FIG. 6.

When Z1-axis contact hand 5 reaches the standby point R, Z2-axis contact hand 5 reaches the takeout point S. After that, Z2-axis Z driving member 6 moves down and sets an IC device onto inspection socket 11. In this case, the index time is the time during which Z1-axis contact hand 5 moves from the inspection position to the takeout point S and Z2-axis contact hand 5 reaches the takeout point S from the standby point P and then reaches inspection sockets 11 from the takeout point S.

Since the moving time from the standby point P to the takeout point S is determined by the moving time of X driving member 12 which has a long moving distance, it is almost equal to the moving time from the standby point P to the center point Q. On the contrary, the moving time of Z1-axis contact hand 5 from the inspection position to the center point Q is longer than the moving time from the inspection position to the takeout point S, and the moving time of Z2-axis contact hand 5 from the center point Q to the inspection position is longer than the moving time from the takeout point S to the inspection position. Therefore, this operation mode of moving the contact hands by way of the takeout point S makes it possible to shorten the index time.

In a case in which the difference in moving distance between X driving member 12 and Z driving member 6 is small, or in a case in which the moving distance of Z driving member 6 is longer than that of X driving member 12, in order to shorten the index time, it is preferable to set the standby points P and R as low as possible to a degree where the contact hands 5 are not disturbed by the mechanisms on the periphery of shuttle 22. In this case, if the standby point P is set to such a low position that the movement of the X driving member 12 causes the moving track of the contact hand 5 to be disturbed by the mechanisms on the periphery of shuttle 22, movement of Z driving member 6 may be started later than that of X driving member 12 to some degree so that contact hand 5 starts to descent in the Z direction from a corrected point T horizontal to the standby point P.

In order to realize a moving track of the contact hand shown by the solid line in FIG. 6, another operation mode is adopted. In this operation mode, as shown in FIG. 7, the leftward movement of X driving member 12 and the downward movement of the Z2-axis driving system are started almost simultaneously at the time when Z1-axis driving system starts upward movement and Z1-axis contact hand 5 reaches the takeout point S, the upward movement of the Z1-axis driving system and the movement of the X driving member are stopped almost simultaneously, and then, the Z2-axis driving system is moved downward until an IC device held by the contact hand is pressed against inspection socket 11. By thus setting the periods of the X-direction movement and the Z-direction movement so that they overlap with each other, the index time can be shortened without varying accelerations and maximum speeds of the X-direction and Z-direction driving systems. In this embodiment, the index time is shortened by more than about 30% compared to that of the operation mode shown by the alternate long and short dashed line in FIG. 6.

FIGS. 8A and 8B are cross-sectional views showing the structure of a main part of the contact hand 5 in this embodiment. Contact hand 5 is mounted so that the angle thereof is changeable and the center position thereof is adjustable within a predetermined range with respect to aligning mechanism 8. As shown in FIG. 8A, a positioning plate 50 is disposed horizontally at the bottom end of contact hand 5, and a main body 51 attached to aligning mechanism 8 is mounted on the upper surface of positioning plate 50. A plurality of guide holes 50a are formed on the periphery of positioning plate 50. When contact hand 5 comes close to the inspection socket 11, parts supply stage 23 or parts discharge stage 24, guide holes 50a are fitted on guide pins 60 formed on the upper surface of inspection socket 11, parts supply stage 23 or parts discharge stage 24, thereby positioning contact hand 5 accurately.

On the lower surface of positioning plate 50, a presser member 52 made of synthetic resin and provided with a presser surface 52a for pressing outer terminals 61a of an IC device 61 against an unillustrated inspection pad of inspection socket 11 is mounted so as to project downward. A holding frame 53 for holding the position of IC device 61 is placed inside presser member 52. Contact hand 5 is provided with a center through hole inside thereof in which a guide block 54 is fitted movably up and down. A suction head 55 made of synthetic rubber is mounted on guide block 54.

An elastic member 56 formed of a coil spring or the like is housed on guide block 54 to urge guide block 54 downward. The center through hole formed inside the contact hand 5 is connected to an exhaust device which is not illustrated, and the IC device 61 is held by suction head 55.

When no load is imposed from outside before the IC device 61 is held by suction, suction head 55 and IC device 61 are pressed down by elastic member 56 in a state shown in FIG. 8A.

On the other hand, when the IC device 61 is held with suction by suction head 55, since there is negative pressure inside the center through hole of the 35 contact hand 5, a package of IC device 61 is positioned in contact with the holding frame 53 as shown in FIG. 8B, and the outer terminals 61a of the IC device 61 are brought into contact with the presser surface 52a of the presser member 52.

In this state shown in FIG. 8B, IC device 61 is handled in a precise position, and outer terminals 61a of IC device 61 are pressed against the inspection socket 11 precisely and reliably.

According to this embodiment, since shuttles 21 and 22 are placed on the right and left sides of inspection socket 11, uninspected IC devices are conveyed from parts supply stages 23 of shuttles 21 and 22 toward inspection sockets 11, and inspected IC devices are withdrawn onto the parts discharge stage 24, IC devices can be supplied to the inspection position by the right and left contact hands alternately, and a free linear transfer route can be taken. Therefore, the index time can be shortened relatively easily without increasing the manufacturing cost.

In this embodiment, particularly, since two contact hands are moved in the X direction by the drive of a single X driving member, a single driving system having a single drive source and a single driving mechanism works sufficiently, which makes it possible to simplify the apparatus structure and to reduce the manufacturing cost.

In this embodiment, since movable member 7, aligning mechanisms 8 and contact hands 5 are only supported by the X driving member 12 and Z-axis driving systems each consisting of servomotor 3, ball screw 4 and Z driving member 6 are supported by frame 10, the weight load on the X-axis driving system can be reduced. This enhances acceleration and deceleration performance and driving accuracy of the X-axis driving system. Therefore, it is possible to speed up the operation and further shorten the index time without changing the driving ability.

Although the inspection apparatus for making an electrical inspection on IC devices is described in the above embodiment, the present invention can be applied not only to such an inspection apparatus, but also to parts handling apparatuses used in various types of working machines and assembling machines.

Furthermore, although two contact hands are operated by a single X-axis driving system in the above embodiment, separately controlled driving systems may be provided for the respective contact hands. In this case, the two contact hands may be moved in the horizontal direction at different speeds and timings in order to further shorten the index time.

As mentioned above, the present invention has the following advantages.

Since the first handling section and the second handling section are placed on both sides of the processing section and parts are supplied and discharged alternately from both sides by the first holding section and the second holding section, the conveyance route of the parts is freely determined and the index time can be shortened by short-circuiting the conveyance route.

Additionally, since the first and second holding sections are moved linearly close to and apart from the processing section and the first and second handling sections by being moved linearly in the first direction by the main driving means between the processing section and the first and second handling sections, it is possible to simplify the structures of the main driving means and the first and second auxiliary driving means and to reduce the manufacturing cost of the apparatus.

Although the first and second auxiliary driving means respectively move the first and second holding sections by moving the first and second connecting members by means of the first and second drive sources, since the first and second connecting members are movable in the first direction, the first and second auxiliary driving means do not obstruct the movement made by the main driving means and the driving load of the main driving means can be reduced. Therefore, it is easy to increase the driving speed of the first and second holding sections and to maintain driving accuracy.

Since the period of movement made by the main driving means and the period of movement made by the first and second auxiliary driving means overlap, it is possible to optimize the moving route of the first and second holding sections, and to further shorten the index time by changing the setting of the moving route.

Since the first and second holding sections are moved by a single driving system in the same direction at the same speed, it is possible to simplify the structure of the driving system and to reduce the manufacturing cost of the apparatus.

While the invention has been described in conjunction with several specific embodiments, it is evident to those skilled in the art that many further alternatives, modifications and variations will be apparent in light of the foregoing description. Thus, the invention described herein is intended to embrace all such alternatives, modifications, applications and variations as may fall within the spirit and scope of the appended claims.

What is claimed is:

1. A method for subjecting a part to a predetermined process on a processing section comprising the steps of:
    (a) supplying a first part placed at a first handling section located at a first side of the processing section;
    (b) subjecting a second part to the predetermined process at the processing section;
    (c) after step (b), moving the second part from the processing section to a second handling section located at a second side of said processing section;
    (d) contemporaneously with step (c) moving the first part from the first handling section to the processing section;
    (e) after step (d), subjecting the first part to the predetermined process at the processing section;
    (f) after step (e), discharging the second part at the second handling section;
    (g) after step (f), supplying a third part at the second handling section;
    (h) after step (g), moving the third part from the second handling section to the processing section;
    (i) contemporaneously with step (h), moving the first part from the processing section to the first handling section;
    (j) after step (h), subjecting the third part to the predetermined process at the processing section; and
    (k) after step (i), discharging the first part at the first handling section.

2. A method according to claim 1, further comprising the steps of:
    (l) repeating steps(a)–(k) a predetermined number of times.

3. A method according to claim 1,
    wherein in step (a), the first part is placed at a first handling section by movement parallel to a first axis,
    wherein in step (f), the second part is discharged at the second handling section by movement parallel the first axis,
    wherein in step (c), the second part is moved parallel to a second axis and a third axis,
    wherein in step (d) the first part is moved parallel to the second axis and the third axis,
    wherein the first axis is orthogonal to the second axis,
    wherein the second axis is orthogonal to the third axis, and
    wherein the first axis is orthogonal to the third axis.

* * * * *